(12) United States Patent
Kim

(10) Patent No.: US 9,231,039 B2
(45) Date of Patent: Jan. 5, 2016

(54) ORGANIC LIGHT EMITTING DIODE DISPLAY

(71) Applicant: Samsung Display Co., Ltd., Yongin, Gyeonggi-Do (KR)

(72) Inventor: Ok-Byoung Kim, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 303 days.

(21) Appl. No.: 14/014,045

(22) Filed: Aug. 29, 2013

(65) Prior Publication Data

US 2014/0320544 A1 Oct. 30, 2014

(30) Foreign Application Priority Data

Apr. 24, 2013 (KR) .................. 10-2013-0045561

(51) Int. Cl.
*G09G 3/32* (2006.01)
*H01L 27/32* (2006.01)

(52) U.S. Cl.
CPC .......... *H01L 27/3262* (2013.01); *G09G 3/3233* (2013.01); *G09G 2300/0426* (2013.01); *G09G 2300/0439* (2013.01); *G09G 2300/0819* (2013.01); *G09G 2300/0852* (2013.01); *G09G 2300/0861* (2013.01); *G09G 2320/043* (2013.01)

(58) Field of Classification Search
CPC .................. G09G 3/3233; G09G 2300/0426; G09G 2300/0439; G09G 2310/0251; G09G 2320/0233; G09G 3/3258; G09G 2300/043; G09G 3/3208; G09G 3/30; H01L 27/3262
See application file for complete search history.

(56) References Cited

U.S. PATENT DOCUMENTS

| 2010/0141644 A1* | 6/2010 | Lee et al. .................. 345/214 |
| 2011/0134157 A1* | 6/2011 | Chaji ........................ 345/690 |
| 2013/0119412 A1* | 5/2013 | Kasai et al. ................ 257/88 |
| 2014/0070184 A1* | 3/2014 | Shin ........................... 257/40 |

FOREIGN PATENT DOCUMENTS

| KR | 10-0528692 B1 | 11/2005 |
| KR | 10-0876250 B1 | 12/2008 |

* cited by examiner

*Primary Examiner* — Amare Mengistu
*Assistant Examiner* — Gloryvid Figueroa-Gibson
(74) *Attorney, Agent, or Firm* — Knobbe Martens Olson & Bear LLP

(57) ABSTRACT

An organic light emitting diode (OLED) display is provided. One inventive aspect includes: a substrate, a scan line formed on the substrate and transmitting a scan signal, a data line configured to intersect the scan line and to transmit a data signal, a switching transistor connected to the scan line and the data line, a driving transistor connected to a switching drain electrode of the switching transistor, a compensation transistor connected to the driving transistor, an aging transistor connected to a driving drain electrode of the driving transistor and a source electrode of the compensation transistor, and an organic light emitting diode (OLED) connected to a driving drain electrode of the driving transistor. The compensation transistor is configured to compensate a threshold voltage of the driving transistor. The aging transistor is configured to perform an aging process for reducing a leakage current of the compensation transistor.

18 Claims, 8 Drawing Sheets

ORGANIC LIGHT EMITTING DIODE DISPLAY

CROSS-REFERENCE TO RELATED APPLICATIONS

This application claims priority to and the benefit of Korean Patent Application No. 10-2013-0045561 filed in the Korean Intellectual Property Office on Apr. 24, 2013, the entire contents of which are incorporated herein by reference.

BACKGROUND

1. Field

The described technology relates generally to an organic light emitting diode (OLED) display.

2. Description of the Related Technology

An organic light emitting diode (OLED) includes two electrodes and an organic emission layer. The organic emission layer is disposed between the two electrodes. Electrons injected from one electrode and holes injected from the other electrode are combined in the organic emission layer. As such, excitons are formed and light is emitted by energy generated from the excitons.

An organic light emitting diode (OLED) display includes a plurality of pixels, each pixel having at least one organic light emitting diode (OLED) of a self-light emitting element. Each pixel further includes a plurality of transistors and a plurality of capacitors to drive the organic light emitting diode (OLED). The plurality of transistors include a switching transistor and a driving transistor.

A driving transistor flows a current of one magnitude through a driving semiconductor layer. As such, a compensation transistor for compensating a threshold voltage and a light emission control transistor for controlling light emitting may provide another current of the same magnitude. In order to quickly compensate the threshold voltage of the driving transistor when a length of the driving semiconductor layer of the driving transistor is short, an s-factor of a transistor characteristic curve decreases and a change rate of the current increases according to a change of the voltage applied to the driving gate electrode. As such, a large current is provided to the organic light emitting diode (OLED). However, this may cause spots. In contrast, when the length of the driving semiconductor layer of the driving transistor is long enough to prevent the spots, the threshold voltage of the driving transistor is slowly compensated by a small current such that low grayscale compensation is not obtained and the spots are generated.

The above information disclosed in this Background section is only for enhancement of understanding of the background of the described technology and therefore it disclosed technology contains information that does not form the prior art that is already known in this country to a person of ordinary skill in the art.

SUMMARY OF CERTAIN INVENTIVE ASPECTS

One inventive aspect relates to an organic light emitting diode (OLED) display having a reduced leakage current of a compensation transistor. More particularly, a low grayscale spot of the organic light emitting diode display is prevented by decreasing a threshold voltage of the compensation transistor.

An organic light emitting diode (OLED) display according to an exemplary embodiment includes: a substrate, a scan line formed on the substrate and configured to transmit a scan signal, a data line configured to intersect the scan line and to transmit a data signal, a switching transistor connected to the scan line and the data line, a driving transistor connected to a switching drain electrode of the switching transistor, a compensation transistor connected to the driving transistor an aging transistor connected to a driving drain electrode of the driving transistor and a source electrode of the compensation transistor, and an organic light emitting diode (OLED) connected to a driving drain electrode of the driving transistor. The compensation transistor is configured to compensate a threshold voltage of the driving transistor. The aging transistor is configured to perform an aging process for reducing a leakage current of the compensation transistor.

A light emission control transistor that is turned on by a light emission control signal transferred by a light emission control line to transfer the driving voltage from the driving transistor to the organic light emitting diode may be further included, and the light emission control transistor may be positioned between the driving drain electrode and the organic light emitting diode (OLED).

The compensation semiconductor layer may be split from a middle part of the driving semiconductor layer, and the light emission control semiconductor layer of the light emission control transistor may be connected to a driving drain region of the driving semiconductor layer.

The aging semiconductor layer of the aging transistor may connect a compensation semiconductor layer of the compensation transistor and the light emission control semiconductor layer.

The aging gate electrode of the aging transistor may overlap the aging semiconductor layer.

The compensation gate electrode of the compensation transistor may include a first compensation gate electrode and a second compensation gate electrode separated from each other.

A storage capacitor connected between the driving voltage line and the driving gate electrode of the driving transistor may be further included, and the storage capacitor may include a first storage capacitive plate formed with the same layer as the driving semiconductor layer and a second storage capacitive plate overlapping the first storage capacitive plate and formed with the same layer as the scan line.

A boosting capacitor connected to the storage capacitor may be further included, and the boosting capacitor may include a first boosting capacitive plate extended from the first storage capacitive plate, and a second boosting capacitive plate overlapping the first boosting capacitive plate and extended from the scan line.

The first boosting capacitor plate may have a hammer shape, and the first boosting capacitor plate may include a handle portion parallel to the driving voltage line and a head portion formed at the end of the handle portion.

According to the exemplary embodiment, the compensation semiconductor layer is split from the middle part of the driving semiconductor layer, and in a short pass diode structure in which the light emission control semiconductor layer of the light emission control transistor is connected to the driving drain region of the driving semiconductor layer, the aging transistor connecting the driving drain electrode of the driving transistor and the source electrode of the compensation transistor is formed, and thereby the aging process for removing the leakage current of the compensation transistor may be easily performed.

Also, in a short pass diode structure, by forming the aging gate electrode of the aging transistor to overlap the aging semiconductor layer, a short pass through which the current quickly flows from the driving semiconductor layer to the compensation semiconductor layer in the compensation period in which the scan line is turned on is formed such that the threshold voltage Vth of the driving transistor may be quickly compensated, and a long pass through which the current flows from the driving semiconductor layer to the light emission control semiconductor layer in the light emitting period in which the scan line is turned off is formed such that the driving range of the driving semiconductor layer is widened, thereby preventing the stains.

DETAILED DESCRIPTION OF CERTAIN INVENTIVE EMBODIMENTS

Figure 1:
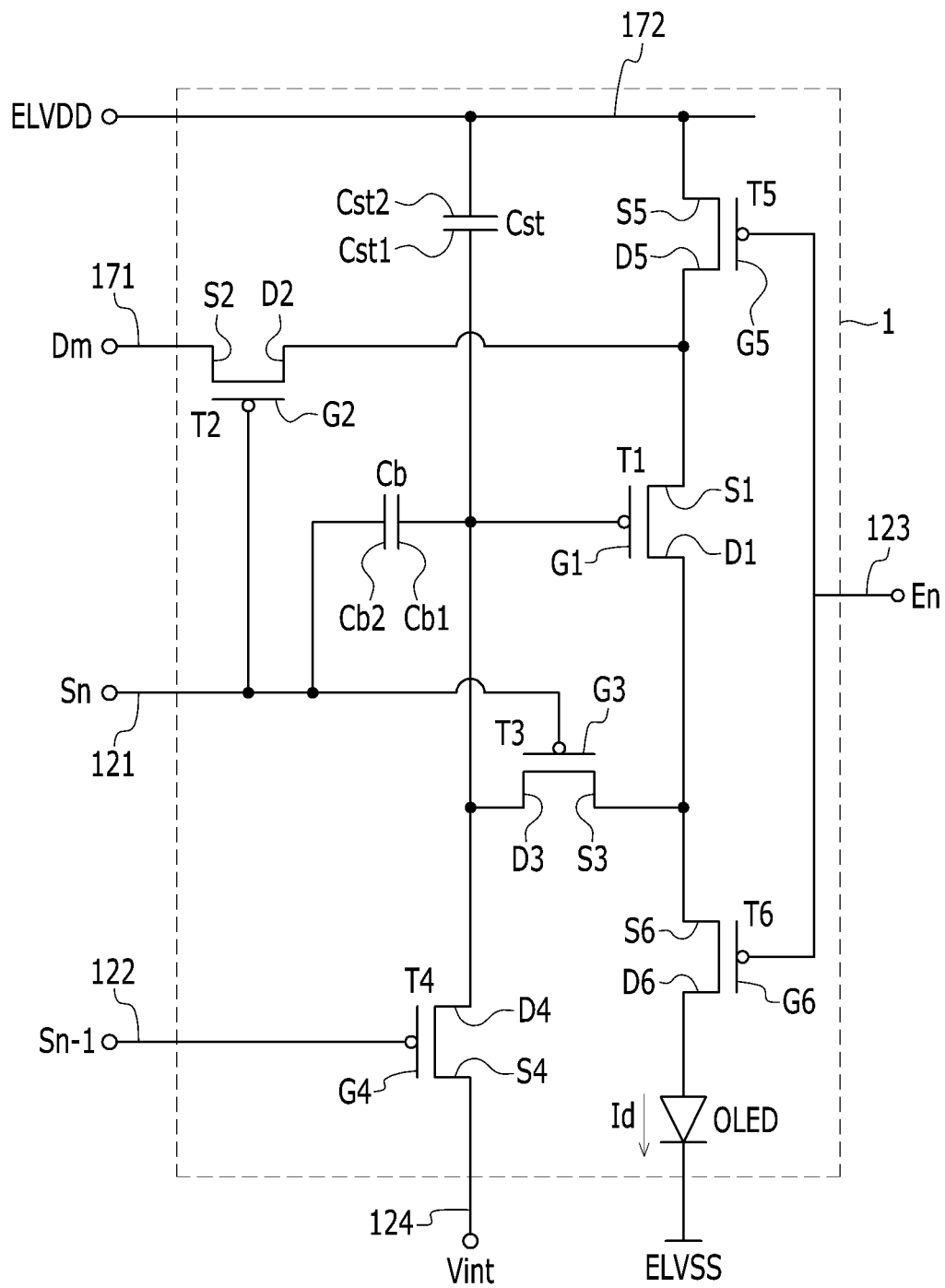
FIG. 1 is an equivalent circuit of one pixel of an organic light emitting diode (OLED) display according to the first exemplary embodiment.

The exemplary embodiment will be described more fully hereinafter with reference to the accompanying drawings, in which exemplary embodiments of the disclosed technology are shown. As those skilled in the art would realize, the described embodiments may be modified in various different ways, all without departing from the spirit or scope of the present disclosed technology.

The drawings and description are to be regarded as illustrative in nature and not restrictive. Like reference numerals designate like elements throughout the specification.

Further, since sizes and thicknesses of constituent members shown in the accompanying drawings are arbitrarily given for better understanding and ease of description, the present disclosed technology is not limited to the illustrated sizes and thicknesses.

In the drawings, the thickness of layers, films, panels, regions, etc., are exaggerated for clarity. In the drawings, for better understanding and ease of description, the thicknesses of some layers and areas are exaggerated. It will be understood that when an element such as a layer, film, region, or substrate is referred to as being "on" another element, it may be directly on the other element or intervening elements may also be present.

In addition, unless explicitly described to the contrary, the word "comprise" and variations such as "comprises" or "comprising" will be understood to imply the inclusion of stated elements but not the exclusion of any other elements.

Throughout this specification, it is understood that the term "on" and similar terms are used generally and are not necessarily related to a gravitational reference.

In addition, in the accompanying drawings, an organic light emitting diode (OLED) display is illustrated as an active matrix (AM)-type OLED display in a 6Tr-1Cap structure in which six thin film transistors (TFTs) and one capacitor are formed in one pixel, but the present disclosed technology is not limited thereto. Therefore, the OLED display may have various structures. For example, a plurality of TFTs and at least one capacitor may be provided in one pixel of the OLED display, and separate wires may be further provided in the OLED display. Here, the pixel refers to a minimum unit for displaying an image, and the OLED display displays an image by using a plurality of pixels.

An organic light emitting diode (OLED) display according to the first exemplary embodiment will be described with reference to FIG. 1 to FIG. 5.

FIG. 1 is an equivalent circuit of one pixel of an organic light emitting diode (OLED) display according to a first exemplary embodiment.

As illustrated in FIG. 1, one pixel 1 of an organic light emitting diode display according to the first exemplary embodiment may include at least a plurality of signal lines 121, 122, 123, 124, 171 and 172, a plurality of transistors T1, T2, T3, T4, T5 and T6, capacitors Cst and Cb and an organic light emitting diode (OLED). The organic light emitting diode may be connected to the plurality of signal lines.

The transistors may include at least one of a driving transistor T1, a switching transistor T2, a compensation transistor T3, an initialization transistor T4, an operation control transistor T5 and a light emission control transistor T6. A capacitor may include at least one of a storage capacitor Cst and a boosting capacitor Cb. The driving transistor T1 may drive a thin film transistor. The switching transistor T2 may switch a thin film transistor.

The signal lines may include at least one of a scan line 121, a prior scan line 122, a light emission control line 123, a data line 171, a driving voltage line 172 and an initialization voltage line 124. The scan line 121 may transfer a scan signal Sn to at least one of the compensation transistor T3 and the initialization transistor T4. The prior scan line 122 may transfer a pior signal Sn−1 to the initialization transistor T4. The light emission control line 123 may transfer a light emission control signal En to at least one of the operation control transistor T5 and the light emission control transistor T6. The data line 171 may cross the scan line 121 and transfer a data signal Dm. The driving voltage line 172 may transfer a driving voltage ELVDD. The driving voltage line 172 may be formed almost in parallel with the data line 171. The initialization voltage line 124 may transfer an initialization voltage Vint and initialize the driving transistor T1.

In one exemplary implementation, a gate electrode G1 of the driving transistor T1 is connected to an end Cst1 of the storage capacitor Cst. A source electrode S1 of the driving transistor T1 may be connected via the operation control transistor T5 to the driving voltage line 172. The drain electrode D1 of the driving transistor T1 may be electrically connected via the light emission control transistor T6 to an anode of the organic light emitting diode (OLED). The driving transistor T1 may receive the data signal Dm according to a switching operation of the switching transistor T2 and supply a driving current Id to the organic light emitting diode (OLED).

A gate electrode G2 of the switching transistor T2 may be connected to at least one of the scan line 121, the other end Cb2 of the boosting capacitor and the gate electrode G3 of the compensation transistor T3. A source electrode S2 of the switching transistor T2 may be connected to the data line 171. A drain electrode D2 of the switching transistor T2 may be connected via the operation control transistor T5 to the driving voltage line 172 while the drain electrode D2 is connected to the source electrode S1 of the driving transistor T1. The switching transistor T2 may be turned on according to the scan signal Sn and perform a switching operation for transferring the data signal Dm to the data line 171 and to the source electrode of the driving transistor T1. The scan signal Sn may be transferred through the scan line 121.

A gate electrode G3 of the compensation transistor T3 may be connected to at least one of the scan line 121, the gate electrode G2 of the switching transistor T2 and the other end Cb2 of the boosting capacitor Cb. A source electrode S3 of the compensation transistor T3 may be connected via the light emission control transistor T6 to the anode of the organic light emitting diode (OLED) while it is connected to the drain electrode D1 of the driving transistor T1. A drain electrode D3 of the compensation transistor T3 may be connected to at least one of one end Cst1 of the storage capacitor Cst, one end Cb1 of the boosting capacitor Cb, a drain electrode D4 of the initialization transistor T4 and the gate electrode G1 of the driving transistor T1. The compensation transistor T3 may be turned on according to the scan signal Sn and connect the gate electrode G1 and the drain electrode D1 of the driving transistor T1 to each other. The scan signal Sn may be transferred through the scan line 121. As such, the compensation transistor T3 may perform diode-connection of the driving transistor T1.

A gate electrode G4 of the initialization transistor T4 may be connected to the prior scan line 122. The source electrode S4 of the initialization transistor T4 may be connected to the initialization voltage line 124. The drain electrode D4 of the initialization transistor T4 may be connected to at least one of one end Cb1 of the boosting capacitor, one end Cst1 of the storage capacitor Cst, the drain electrode D3 of the compensation transistor T3 and the gate electrode G1 of the driving transistor T1. The initialization transistor T4 may be turned on according to the prior scan signal Sn−1 and transfer the initialization voltage Vint to the gate electrode G1 of the driving transistor T1. Therefore, the initialization transistor T4 may perform an initialization operation of initializing the voltage of the gate electrode G1 of the driving transistor T1. The prior scan signal Sn−1 may be transferred through the prior scan line 122.

A gate electrode G5 of the operation control transistor T5 may be connected to the light emission control line 123. A source electrode S5 of the operation control transistor T5 may be connected to the driving voltage line 172. A drain electrode D5 of the operation control transistor T5 may be connected to at least one of the source electrode S1 of the driving transistor T1 and the drain electrode S2 of the switching transistor T2.

A gate electrode G6 of the light emission control transistor T6 may be connected to the light emission control line 123. A source electrode S6 of the light emission control transistor T6 may be connected to at least one of the drain electrode D1 of the driving transistor T1 and the source electrode S3 of the compensation transistor T3. A drain electrode D6 of the light emission control transistor T6 may be electrically connected to the anode of the organic light emitting diode (OLED). The operation control transistor T5 and the light emission control transistor T6 may be simultaneously turned on according to the light emission control signal En and transfer the driving voltage ELVDD to the organic light emitting diode (OLED). As such, the operation control transistor may allow the driving current Id to flow in the organic light emitting diode (OLED). The light emission control signal En may be transferred through the light emission control line 123.

In another exemplary implementation, the other end Cst2 of the storage capacitor Cst is connected to the driving voltage line 172. A cathode of the organic light emitting diode (OLED) may be connected to a common voltage ELVSS. The organic light emitting diode (OLED) may receive the driving current Id from the driving transistor T1 and emit light. As such, the organic light emitting diode may display an image.

Hereinafter, an operation process of one pixel of the organic light emitting diode display according to one exemplary embodiment will be described in detail.

First, the prior scan signal Sn−1 at a low level may be supplied through the prior scan line 122 during an initialization period. Then, the initialization transistor T4 may be turned on corresponding to the prior scan signal Sn−1 at the low level. The initialization voltage Vint may be supplied from the initialization voltage line 124 through the initialization transistor T4 to the gate electrode G1 of the driving transistor T1. The driving transistor T1 may be initialized by the initialization voltage Vint.

Subsequently, the scan signal Sn at the low level may be supplied through the scan line 121 during a data programming period. Then, at least one of the switching transistor T2 and the compensation transistor T3 may be turned on corresponding to the scan signal Sn at the low level.

In this case, the driving transistor T1 may be diode-connected by the turned-on compensation transistor T3 and biased in a forward direction.

Then, a compensation voltage of Dm+Vth may be applied to the gate electrode of the driving transistor T1. The compensation voltage may be obtained by subtracting a threshold voltage Vth of the driving transistor T1 from the data signal Dm. The data signal Dm may be supplied from the data line 171. The threshold voltage Vth may be a negative value.

The driving voltage ELVDD and the compensation voltage of Dm+Vth may be applied to both ends of the storage capacitor Cst. A charge corresponding to a difference between voltages at both ends may be stored in the storage capacitor Cst.

Next, if the voltage level of the scan signal Sn is changed into a high level and the supply of the scan signal Sn is stopped, the voltage applied to the gate electrode G1 of the driving thin film transistor T1 may be changed corresponding to the change width of the voltage of the scan signal Sn by the coupling of the boosting capacitor Cb. At this time, the voltage applied to the gate electrode G1 of the driving thin film transistor T1 may be changed by charge sharing between the storage capacitor Cst and the boosting capacitor Cb. As such, the change amount of the voltage applied to the driving gate electrode G1 may be proportional to the charge sharing value between the storage capacitor Cst and the boosting capacitor Cb as well as the change width of the voltage of the scan signal Sn.

Subsequently, a level of the light emission control signal En may be changed from a high level to a low level. The light emission control signal En is supplied from the light emission control line 123 during the light emission period. Then, the operation control thin film transistor T5 and the light emission control thin film transistor T6 may be turned on by the light emission control signal En of the low level during the light emission period.

Then, the driving current Id may be generated according to a difference between the voltage of the gate electrode G1 of the driving thin film transistor T1 and the driving voltage ELVDD. The driving current Id may be supplied to the organic light emitting diode (OLED) through the light emission control thin film transistor T6. A gate-source voltage Vgs of the driving transistor T1 may be maintained at "(Dm+Vth)-ELVDD" by the storage capacitor Cst during the light emission period. The driving current Id may be proportional to a square of a value that is obtained by subtracting the threshold voltage from a source-gate voltage, i.e., "(Dm-ELVDD)$^2$," according to a current-voltage relationship of the driving transistor T1. Accordingly, the driving current Id may be determined regardless of the threshold voltage Vth of the driving transistor T1.

A detailed structure of the pixel of the organic light emitting diode display illustrated in FIG. 1 will be described in detail with reference to FIGS. 2 to 5 together with FIG. 1.

Figure 2:
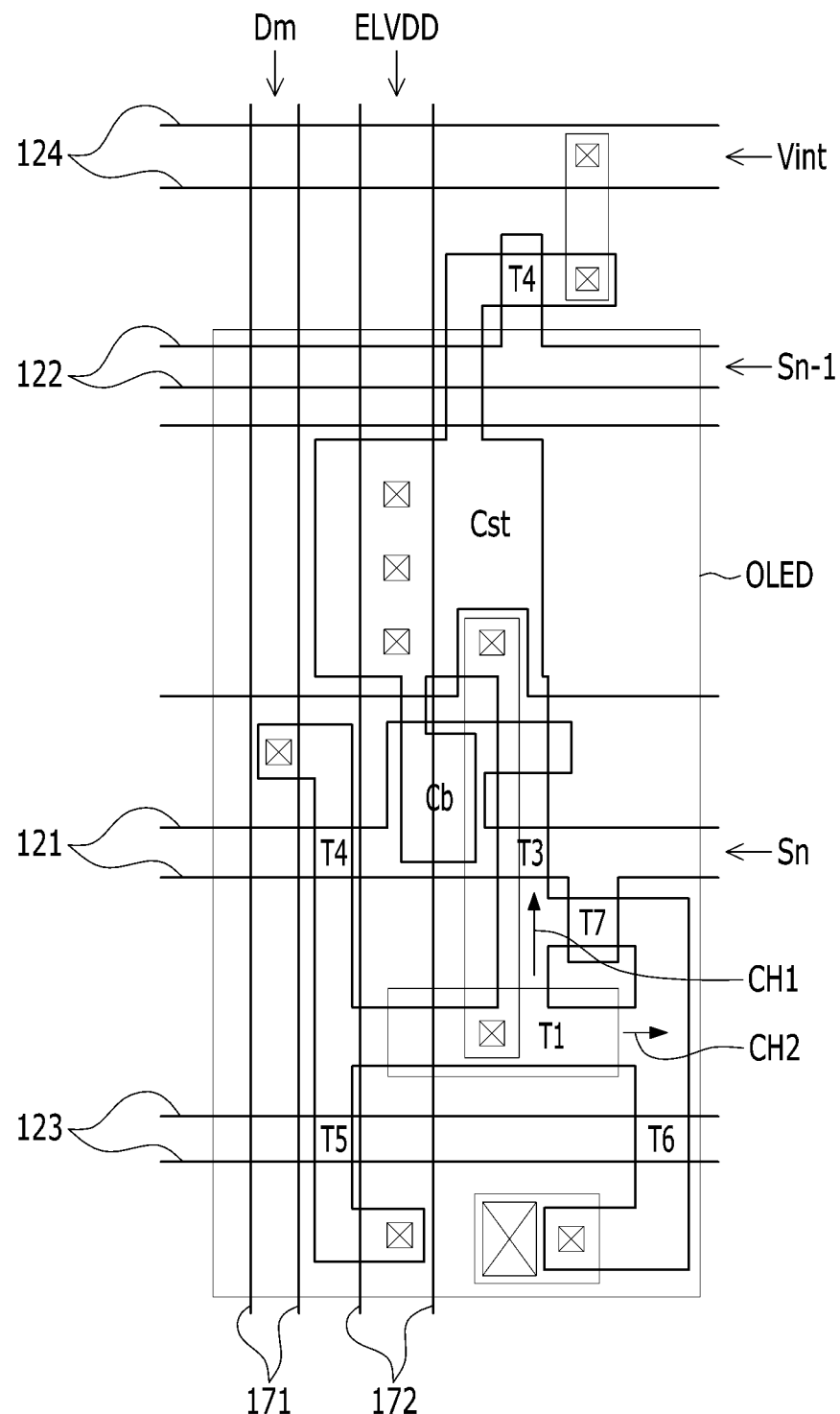
FIG. 2 is a schematic view of a position of a plurality of transistors and capacitors of an organic light emitting diode (OLED) display according to the first exemplary embodiment.
Figure 3:
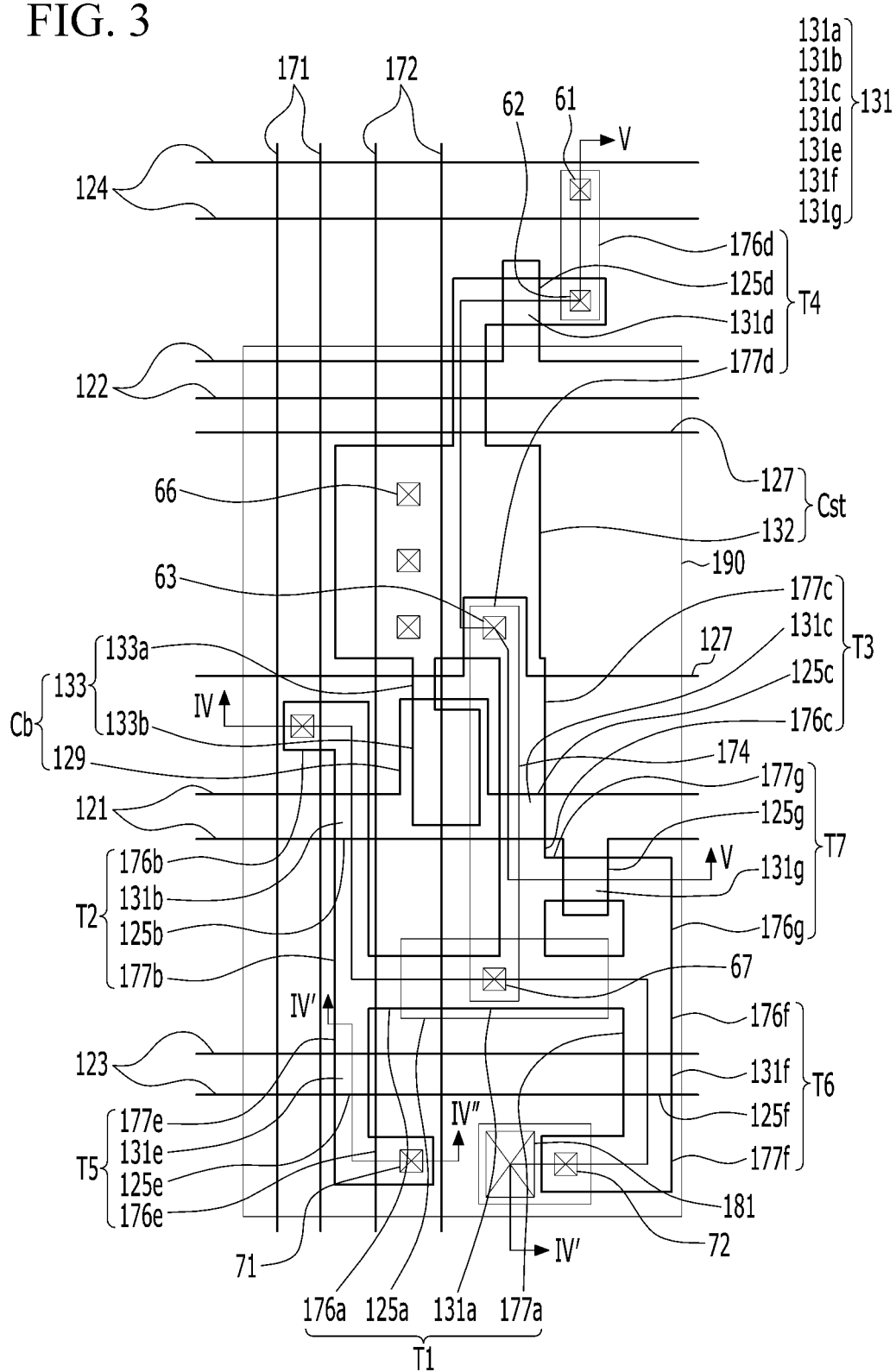
FIG. 3 is a detailed layout view of one pixel of an organic light emitting diode (OLED) display according to the first exemplary embodiment.
Figure 4:
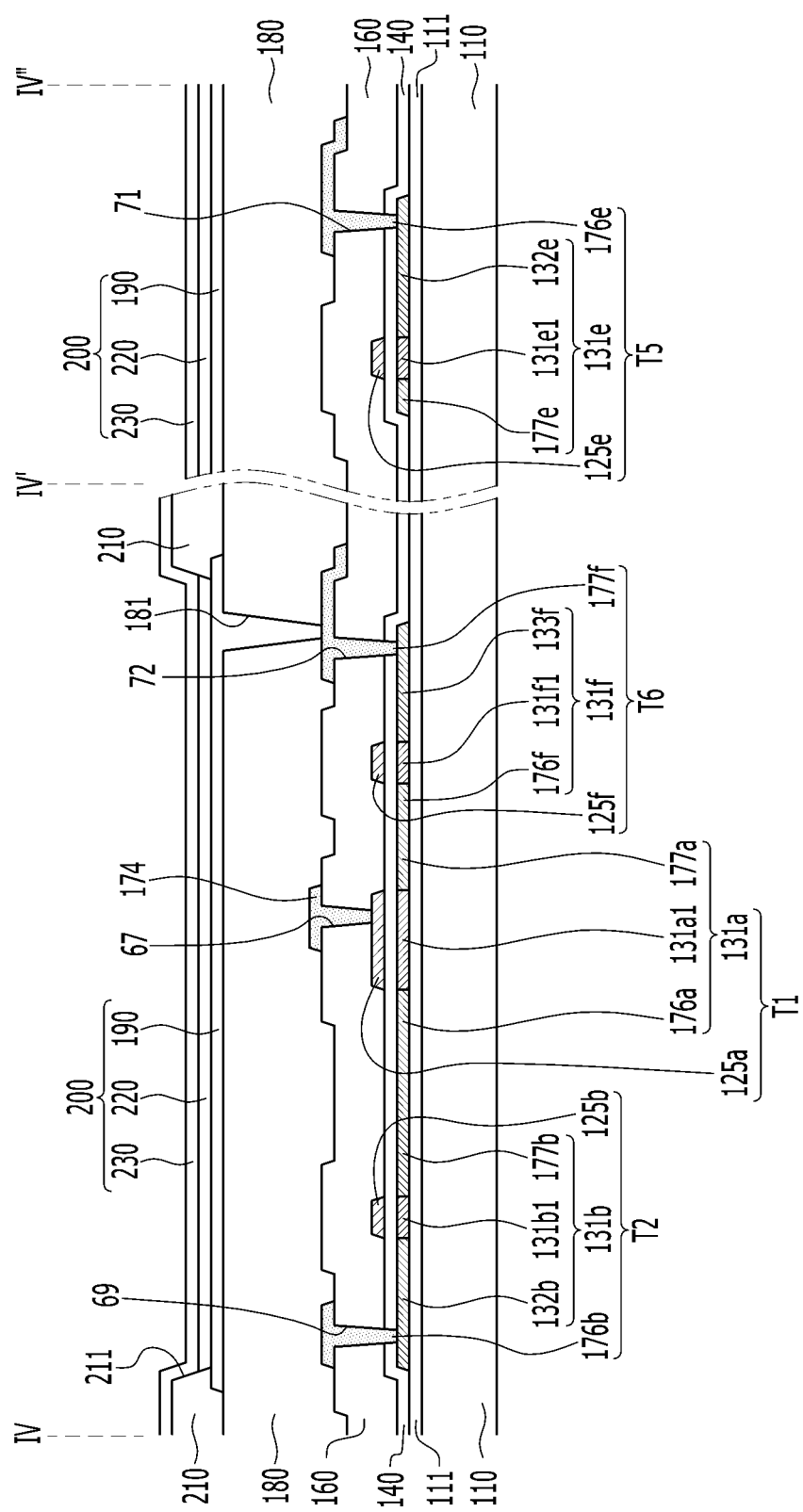
FIG. 4 is a cross-sectional view of the organic light emitting diode (OLED) display of FIG. 3 taken along the line IV-IV'-IV".
Figure 5:
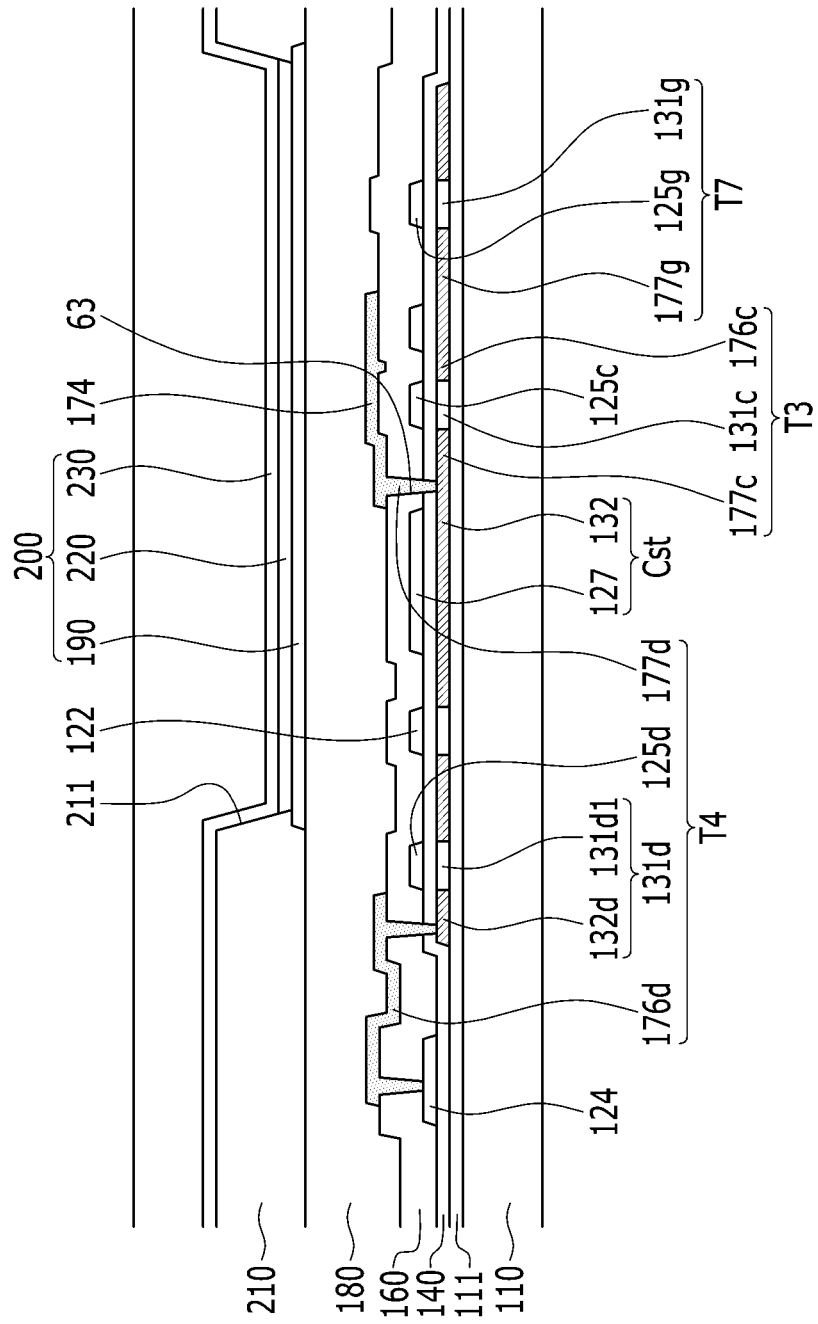
FIG. 5 is a cross-sectional view of the organic light emitting diode (OLED) display of FIG. 3 taken along the line V-V.

FIG. 2 is a schematic view of a position of a plurality of transistors and capacitors of an organic light emitting diode (OLED) display according to the first exemplary embodiment. FIG. 3 is a detailed layout view of one pixel of an organic light emitting diode (OLED) display according to the first exemplary embodiment. FIG. 4 is a cross-sectional view of the organic light emitting diode (OLED) display of FIG. 3 taken along the line IV-IV'-IV." FIG. 5 is a cross-sectional view of the organic light emitting diode (OLED) display of FIG. 3 taken along the line V-V.

As shown in FIG. 2 to FIG. 5, the pixel of the organic light emitting diode (OLED) display according to the first exemplary embodiment may include the scan line 121, the prior scan line 122, the light emission control line 123 and the initialization voltage line 124. The initialization voltage line 124 may apply at least one of the scan signal Sn, the prior scan signal Sn−1, the light emission control signal En and the initialization voltage Vint. The initialization voltage line 124 may be formed in a row direction. At least one of the data line 171 and the driving voltage line 172 may cross all of the scan line 121, the prior scan line 122, the light emission control line 123, the initialization voltage line 124. At least one of the data line 171 and the driving voltage line 172 may apply the data signal Dm and the driving voltage ELVDD, respectively, to the pixel.

Further, at least one of the driving transistor T1, the switching transistor T2, the compensation transistor T3, the initialization transistor T4, the operation control transistor T5, the light emission control transistor T6, the aging transistor T7, the storage capacitor Cst, the boosting capacitor Cb and the organic light emitting diode (OLED) may be formed in the pixel.

At least one of the driving transistor T1, the switching transistor T2, the compensation transistor T3, the initialization transistor T4, the operation control transistor T5, the light emission control transistor T6 and the aging transistor T7 may be formed along a semiconductor layer 131. The semiconductor layer 131 may be formed to be bent in various shapes. The semiconductor layer 131 may be formed of at least one of polysilicon and an oxide semiconductor. The oxide semiconductor may include any one of oxides having titanium (Ti), hafnium (Hf), zirconium (Zr), aluminum (Al), tantalum (Ta), germanium (Ge), zinc (Zn), gallium (Ga), tin (Sn), or indium (In) as a base, and complex oxides thereof, such as zinc oxide (ZnO), indium-gallium-zinc oxide (InGaZnO4), indium-zinc oxide (Zn—In—O), zinc-tin oxide (Zn—Sn—O) indium-gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium-aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium-gallium oxide (In—Ge—Ga—O), titanium-indium-zinc oxide (Ti—In—Zn—O), and hafnium-indium-zinc oxide (Hf—In—Zn—O). In the case where the semiconductor layer 131 is formed of the oxide semiconductor, a separate protective layer may be added to protect the oxide semiconductor that is weak with regard to an external environment such as high temperatures.

The semiconductor layer 131 may include a channel region that is not doped with an impurity. At least one of a source region and a drain region may be formed on both sides of the channel region and be doped with an impurity. Herein, the impurity may be changed according to a kind of thin film transistor. An N-type impurity or a P-type impurity may be applied.

The semiconductor layer 131 may include a driving semiconductor layer 131a, a switching semiconductor layer 131b, a compensation semiconductor layer 131c, an initialization semiconductor layer 131d, an operation control semiconductor layer 131e, a light emission control semiconductor layer 131f and an aging semiconductor layer 131g. The driving semiconductor layer 131a may be formed in the driving transistor T1. The switching semiconductor layer 131b may be formed in the switching transistor T2. The compensation semiconductor layer may be formed in the compensation transistor T3. The initialization semiconductor layer 131d may be formed in the initialization transistor T4. The operation control semiconductor layer 131e may be formed in the operation control transistor T5. The light emission control semiconductor layer 131f may be formed in the light emission control transistor T6. The aging semiconductor layer 131g may be formed in the aging transistor T7.

The driving transistor T1 may include the driving semiconductor layer 131a, a driving gate electrode 125a, a driving source electrode 176a and a driving drain electrode 177a. The driving source electrode 176a may correspond to a driving source region 176a that is doped with the impurity in the driving semiconductor layer 131a. The driving drain electrode 177a may correspond to a driving drain region 177a that is doped with the impurity in the driving semiconductor layer 131a. The driving gate electrode 125a may overlap the driving semiconductor layer 131a and have a rectangular shape.

The driving gate electrode 125a may include the same material at the same layer as at least one of the scan line 121, the prior scan line 122, the light emission control line 123, the initialization voltage line 124, the switching gate electrode 125b, a compensation gate electrode 125c, a second storage capacitive plate 127 and a second boosting capacitive plate 129.

The switching thin film transistor T2 may include the switching semiconductor layer 131b, a switching gate electrode 125b, a switching source electrode 176b and a switching drain electrode 177b. The switching drain electrode 177b may correspond to a switching drain region 177b that is doped with an impurity in the switching semiconductor layer 131b.

The compensation transistor T3 may include the compensation semiconductor layer 131c, the compensation gate electrode 125c, a compensation source electrode 176c and a compensation drain electrode 177c. The compensation source electrode 176c may correspond to a compensation source region that is doped with an impurity in the compensation semiconductor layer 131c.

The aging transistor T7 may include the aging semiconductor layer 131g, an aging gate electrode 125g, an aging source electrode 176g and an aging drain electrode 177g. The aging source electrode 176g may correspond to the compensation source region that is doped with an impurity in the aging semiconductor layer 131g. The aging drain electrode 177g may correspond to a compensation drain region that is doped with an impurity in the aging semiconductor layer 131g.

The aging transistor T7 may connect the driving drain electrode 177a of the driving transistor T1 and the compensation source electrode 176c of the compensation transistor T3. That is, the aging semiconductor layer 131g of the aging transistor T7 may connect the compensation semiconductor layer 131c of the compensation transistor T3 and the light emission control semiconductor layer 131f.

The compensation semiconductor layer 131c may be diverged from a middle part of the driving semiconductor layer 131a. The light emission control semiconductor layer 131f of the light emission control transistor T6 may be connected to the driving drain region 177a of the driving semiconductor layer 131a.

The initialization transistor T4 may include the initialization semiconductor layer 131d, an initialization gate electrode 125d, an initialization source electrode 176d and an initialization drain electrode 177d. The initialization semiconductor layer 131d may include at least one of an initialization channel region 131d1 and an initialization source region 132d. One end of the initialization source electrode 176d may be connected to the initialization voltage line 124 through a contact hole 61. The contact hole 61 may be formed in an interlayer insulating layer 160. The other end of the initialization source electrode 176d may be connected to the initialization semiconductor layer 131d through a contact hole 62. The contact hole 62 may be formed in a gate insulating layer 140 and the interlayer insulating layer 160. The initialization drain electrode 177d as the other end of a connection member 174 may be connected to the initialization semiconductor layer 131d through a contact hole 63. The contact hole 63 may be formed in the gate insulating layer 140 and the interlayer insulating layer 160.

The operation control transistor T5 may include the operation control semiconductor layer 131e, an operation control gate electrode 125e, an operation control source electrode 176e and an operation control drain electrode 177e. The operation control semiconductor layer 131e may include a operation control channel region 131e1, an operation control source region 132e and a operation control drain region 177e. The operation control source electrode 176e may be a portion of the driving voltage line 172 and be connected through a contact hole 71 to an operation control source region 132e. The operation control drain electrode 177e may correspond to an operation control drain region 177e. The operation control drain region 177e may be doped with the impurity in the operation control semiconductor layer 131e.

The light emission control transistor T6 may include the light emission control semiconductor layer 131f, a light emission control gate electrode 125f, a light emission control source electrode 176f and a light emission control drain electrode 177f. The light emission control source electrode 176f may correspond to a light emission control source region 176f. The light emission control source region may be doped with the impurity in the light emission control semiconductor layer 131f.

One end of the driving semiconductor layer 131a of the driving transistor T1 may be connected to the switching semiconductor layer 131b and the operation control semiconductor layer 131e. The other end of the driving semiconductor layer 131a may be connected to the compensation semiconductor layer 131c and the light emission control semiconductor layer 131f. Therefore, the driving source electrode 176a may be connected to the switching drain electrode 177b and the operation control drain electrode 177e. The driving drain electrode 177a may be connected to the compensation source electrode 176c and the light emission control source electrode 176f.

The storage capacitor Cst may include a first storage condenser plate 132 and the second storage condenser plate 127 with the gate insulating layer 140 interposed therebetween. Herein, the gate insulating layer 140 may be a dielectric material. A storage capacitance may be determined by charges accumulated in the storage capacitor Cst and a voltage between both condenser plates 132 and 127.

The first storage capacitive plate 132 may be formed with the same layer and the same material as the semiconductor layer 131. The second storage capacitive plate 127 may be connected to an adjacent pixel and be formed with the same layer and the same material as the scan line 121, the prior scan line 122, the light emission control line 123 and the initialization voltage line 124.

The first storage capacitive plate 132 of the storage capacitor Cst may be connected to the compensation source electrode 176c and the initialization drain electrode 177d. The first storage capacitive plate 132 of the storage capacitor Cst may be further connected to the driving gate electrode 125a through the connection member 174. Here, the connection member 174 may be formed with the same layer as the data line 171. The connection member 174 may be connected to the first storage capacitive plate 132 through the contact hole 63. The contact hole 63 may be formed in at least one of the interlayer insulating layer 160 and the gate insulating layer 140. The first storage capacitive plate 132 of the storage capacitor Cst may be further connected to the driving gate electrode 125a through a contact hole 67. The contact hole 67 may be formed in the interlayer insulating layer 160.

The second storage capacitive plate 127 of the storage capacitor Cst may be connected to the common voltage line 172 through a contact hole 66. The second storage capacitive plate 127 of the storage capacitor Cst may be almost in parallel with the scan line 121.

A first boosting condenser plate 133 of the boosting capacitor Cb may be an extension portion extending from the first storage condenser plate 132. The second boosting condenser plate 129 may be a protruding portion protruding upward from the scan line 121.

The first boosting condenser plate 133 may have a hammer shape. The first boosting condenser plate 133 may include a handle portion 133a and a head portion 133b. The handle portion 133a may be parallel with the driving voltage line 172. The head portion 133b may be formed at an end of the handle portion 133a. The head portion 133b of the first boosting capacitive plate 133 may overlap the second boosting capacitive plate 129.

Meanwhile, the switching thin film transistor T2 may be used as a switching element for selecting a pixel that is to emit light. The switching gate electrode 125b may be connected to the scan line 121. The switching source electrode 176b may be connected to the data line 171. The switching drain electrode 177b may be connected to the driving thin film transistor T1 and the first light emission control thin film transistor T5. In addition, the light emission control drain electrode 177f of the light emission control thin film transistor T6 may be directly connected to a pixel electrode 190 of an organic light emitting diode 200 through a contact hole 181. The contact hole 181 may be formed in a protective layer 180.

Hereinafter, referring to FIG. 4 and FIG. 5, a structure of an organic light emitting diode display according to one exemplary embodiment will be described in detail according to the layering order.

In this case, the structure of the transistor will be described based on the driving transistor T1, the switching transistor T2, the compensation transistor T3 and the light emission control transistor T6. The transistors T4 and T5 may be the same as most of the deposition structure of at least one of the driving transistor T1, the switching transistor T2, the compensation transistor T3 and the light emission control transistor T6 such that they are not described in further detail.

A buffer layer 111 may be formed on a substrate 110. The substrate 110 may be formed as an insulating substrate made of glass, quartz, ceramics, plastics, or the like.

At least one of the driving semiconductor layer 131a, the switching semiconductor layer 131b and the light emission control semiconductor layer 131f is formed on the buffer layer 111. The driving semiconductor layer 131a may include the driving source region 176a and the driving drain region 177a. The driving source region 176a and the driving drain region 177a may face each other with a driving channel region 131a1 and a driving channel region 131a1 interposed therebetween. The switching semiconductor layer 131b may include a switching source region 132b and a switching drain region 177b. The switching source region 132b and the switching drain region 177b may face each other with a switching channel region 131b1 interposed therebetween. The light emission control thin film transistor T6 may include at least one of a light emission control channel region 131f1, the light emission control source region 176f and a light emission control drain region 133f.

The gate insulating layer 140 may be formed of at least one of silicon nitride (SiNx) and silicon oxide (SiO2). The gate insulating layer 140 may be formed on at least one of the switching semiconductor layer 131a, the driving semiconductor layer 131b and the light emission control semiconductor layer 131f.

The gate wire, the switching gate electrode 125b, and the compensation gate electrode 125c, the prior scan line 122, the light emission control line 123, the second storage capacitive plate 127 and the initialization voltage line 124 may be formed on the gate insulating layer 140. The gate wire may include the scan line 121. The scan line 121 may include the driving gate electrode 125a. The prior scan line 122 may include the initialization gate electrode 125d. The light emission control line 123 may include the operation control gate electrode 125e and the light emission control gate electrode 125f.

The driving gate electrode 125a may be separated from the scan line 121. The driving gate electrode 125a may overlap the driving channel region 131a1 of the driving semiconductor layer 131a. In addition, the switching gate electrode 125a may be connected to the scan line 121. The switching gate electrode 125b may overlap the switching channel region 131b1 of the switching semiconductor layer 131b. In addition, the light emission control gate electrode 125f may overlap the light emission control channel region 131f1 of the light emission control semiconductor layer 131f.

The second storage capacitive plate 127 may overlap the first storage capacitive plate 132 and thereby form the storage capacitor Cst. The first storage capacitive plate 132 may be formed with the same layer as the driving semiconductor layer 131a.

The interlayer insulating layer 160 may be formed on at least one of the gate wires 125a, 125b, 125c, 125d, 125e, 125f, 121, 122, 123, 124 and 127. The gate insulating layer 140 and the interlayer insulating layer 160 together may have a contact hole 72. The contact hole 72 may expose the light emission control drain region 133f of the light emission control semiconductor layer 131f. The interlayer insulating layer 160, like the gate insulating layer 140, may be made of a ceramic-based material such as silicon nitride (SiNx) or silicon oxide (SiO2).

Data wires, the driving voltage line 172, the connection member 174 and the light emission control drain electrode 177f may be formed on the interlayer insulating layer 160. The data wires may include the data line 171. The data line 171 may include the switching source electrode 176b.

In addition, the switching source electrode 176b and the light emission control drain electrode 177f may be connected through contact holes 69 and 72 to at least one of the switching source region 132b of the switching semiconductor layer 131b and the light emission control drain region 133f of the light emission control semiconductor layer 131f. At least one of the contact holes 69 and 72 may be formed in the interlayer insulating layer 160 and the gate insulating layer 140.

The protective layer 180 may cover the data wires 171, 172, 174 and 177f and be formed on the interlayer insulating layer 160. The pixel electrode 190 may be formed on the protective layer 180. The pixel electrode 190 may be connected through the contact hole 181 to the light emission control drain electrode 177f. The contact hole 181 may be formed in the protective layer 180.

A barrier rib 210 may be formed on an edge of the pixel electrode 190 and the protective layer 180. The barrier rib 210 may have a barrier rib opening 211 through which the pixel electrode 190 is exposed. The barrier rib 210 may be made of a resin such as a polyacrylate, a polyimide, and/or a silica-based inorganic material.

An organic light emitting member 220 may be formed on the pixel electrode 190 that is exposed through the barrier rib opening 211. A common electrode 230 may be formed on the organic light emitting member 220. As described above, the organic light emitting diode (OLED) 200 may include the pixel electrode 190, the organic light emitting member 220 and the common electrode 230.

Here, the pixel electrode 190 may be an anode as a hole injection electrode and the common electrode 230 may be a cathode as an electron injection electrode. In one exemplary embodiment according to the present disclosed technology is not limited thereto, the pixel electrode 190 is the cathode and the common electrode 230 is the anode according to the driving method of the organic light emitting diode display. Holes and electrons may be injected from the pixel electrode 190 and the common electrode 230 into the organic emission layer 220. When excitons fall from an exited state to a ground state, light is emitted. The excitons may be combined injected holes and electrons.

Further, the organic emission layer 220 may be formed as a multilayer that includes at least one of an emission layer, a hole injection layer HIL, a hole transport layer HTL, an electron transport layer ETL and an electron injection layer EIL. In the case where all the emission layer, the hole injection layer HIL, the hole transport layer HTL, the electron transport layer ETL and the electron injection layer EIL are included, the hole injection layer HIL may be disposed on the pixel electrode 190. The pixel electrode 190 may be the anode. The hole transport layer HTL, the emission layer, the electron transport layer ETL and the electron injection layer EIL may be sequentially laminated thereon.

The organic emission layer may include a red organic emission layer emitting light having a red color, a green organic emission layer emitting light having a green color and a blue organic emission layer emitting light having a blue color. The red organic emission layer, the green organic emission layer and the blue organic emission layer may be respectively formed in a red pixel, a green pixel, and a blue pixel to implement a color image.

Further, the organic emission layer may implement the color image by laminating all of the red organic emission layer, the green organic emission layer and the blue organic emission layer in the red pixel, the green pixel and the blue pixel together, and by forming a red color filter, a green color filter and a blue color filter for each pixel. As another example, a white organic emission layer emitting light and having a white color may be formed in all of the red pixel, the green pixel and the blue pixel. The red color filter, the green color filter and the blue color filter may be formed for each pixel to implement the color image. In the case where the color image is implemented by using the white organic emission layer and the color filter and by using deposition masks for depositing the red organic emission layer, the green organic emission layer and the blue organic emission layer on each pixel. That is the red pixel, the green pixel, and the blue pixel, may not be used.

A white organic emission layer described in another example is formed of one organic emission layer, and includes a constitution in which a plurality of organic emission layers are laminated to emit light having a white color. For example, at least one of a first constitution in which at least one yellow organic emission layer and at least one blue organic emission layer are combined to emit light having a white color, a second constitution in which at least one cyan organic emission layer and at least one red organic emission layer are combined to emit light having a white color and a third constitution in which at least one magenta organic emission layer and at least one green organic emission layer are combined to emit light having the white color, or the like, is included.

The driving transistor T1 may include the driving semiconductor layer 131a, the driving gate electrode 125a, the driving source electrode 176a and the driving drain electrode 177a.

The compensation semiconductor layer 131c may be split from the middle part of the driving semiconductor layer 131a. The light emission control semiconductor layer 131f of the light emission control transistor T6 may be connected to the driving drain region 177a of the driving semiconductor layer 131a such that a length of a first path CH1 from the driving semiconductor layer 131a to the compensation semiconductor layer 131c and another length of a second path CH2 from the driving semiconductor layer 131a to the light emission control semiconductor layer 131f are different from each other and thereby currents of different magnitudes may simultaneously flow. As described above, a structure in which the path lengths of the semiconductor layer are different is referred to as a short pass diode. The length of the first path CH1 may be shorter than the length of the second path CH2 such that a relatively larger current may flow in the first path CH1 and a relatively smaller current may simultaneously flow in the second path CH2. As described above, by using one driving transistor simultaneously transmitting the currents that have different magnitudes, the threshold voltage may be quickly compensated. Simultaneously the constant current may be provided to the organic light emitting diode (OLED) such that a current deviation between the driving transistors having a characteristic deviation may be reduced. As such, spots due to the magnitude difference of the current size may be prevented, and this driving operation will be described later.

The driving transistor T1 may charge the voltage corresponding to the data signal Dm to the storage capacitor Cst according to the scan signal Sn. The driving transistor T1 may provide the current corresponding to the voltage charged to the storage capacitor Cst to the organic light emitting diode (OLED). At this time, since the threshold voltage of the driving transistor T1 is changed according to the passage of time, the compensation transistor T3 diode may connect the driving transistor T1 according to the scan signal Sn to compensate the threshold voltage Vth of the driving transistor T1.

Accordingly, while the data signal Dm is transmitted, the relatively larger current flowing through the first path CH1 may quickly charge the storage capacitor Cst to a predetermined voltage (i.e., a compensation voltage) through the compensation transistor T3 such that the compensation of the threshold voltage Vth may be realized.

Also, the relatively smaller current flowing through the second path CH2 may be provided to the organic light emitting diode (OLED) through the light emission control transistor T6 such that the spots may be prevented. That is, since a change ratio of the current according to the change of the voltage applied to the driving gate electrode of the driving transistor T1 is small, a current control voltage width (i.e., a data swing range) may increase, and therefore the range of the data voltage expressing the gamma may increase. It may be possible to prevent stains caused by a difference between magnitudes of the currents by reducing a current deviation between the driving thin film transistors having a characteristic deviation (distribution).

Also, in a short pass diode structure, by overlapping the aging gate electrode 125g of the aging transistor T7 to the aging semiconductor layer 131g, the short pass through which the current fast flows from the driving semiconductor layer 131a to the compensation semiconductor layer 131c may be formed in the compensation period and the scan line 121 is turned on such that the threshold voltage Vth of the driving transistor T1 may be quickly compensated. In addition, the long pass through which the current flows from the driving semiconductor layer 131a to the light emission control semiconductor layer 131f may be formed in the light emitting period and the scan line 121 may be turned off such that the driving range of the driving semiconductor layer 131a is widened and thereby stains are prevented.

Also, in a short pass diode structure, by forming the aging transistor T7, the aging semiconductor layer 131g of the aging transistor T7 may connect the compensation semiconductor layer 131c of the compensation transistor T3 and the light emission control semiconductor layer 131f to each other. The aging transistor T7 may connect the driving drain electrode 177a of the driving transistor T1 and the source electrode 176c of the compensation transistor T3 to each other. Accordingly, the path for applying the aging voltage in the aging process may be obtained such that the aging process for removing the leakage current of the compensation transistor T3 may be performed.

Meanwhile, in a second exemplary embodiment, a dual compensation gate electrode is formed. The compensation gate electrode may include a first compensation gate electrode and a second compensation gate electrode to reduce an off-leakage current.

Next, an organic light emitting diode (OLED) display according to the second exemplary embodiment will be described with reference to FIG. 6.

Figure 6:
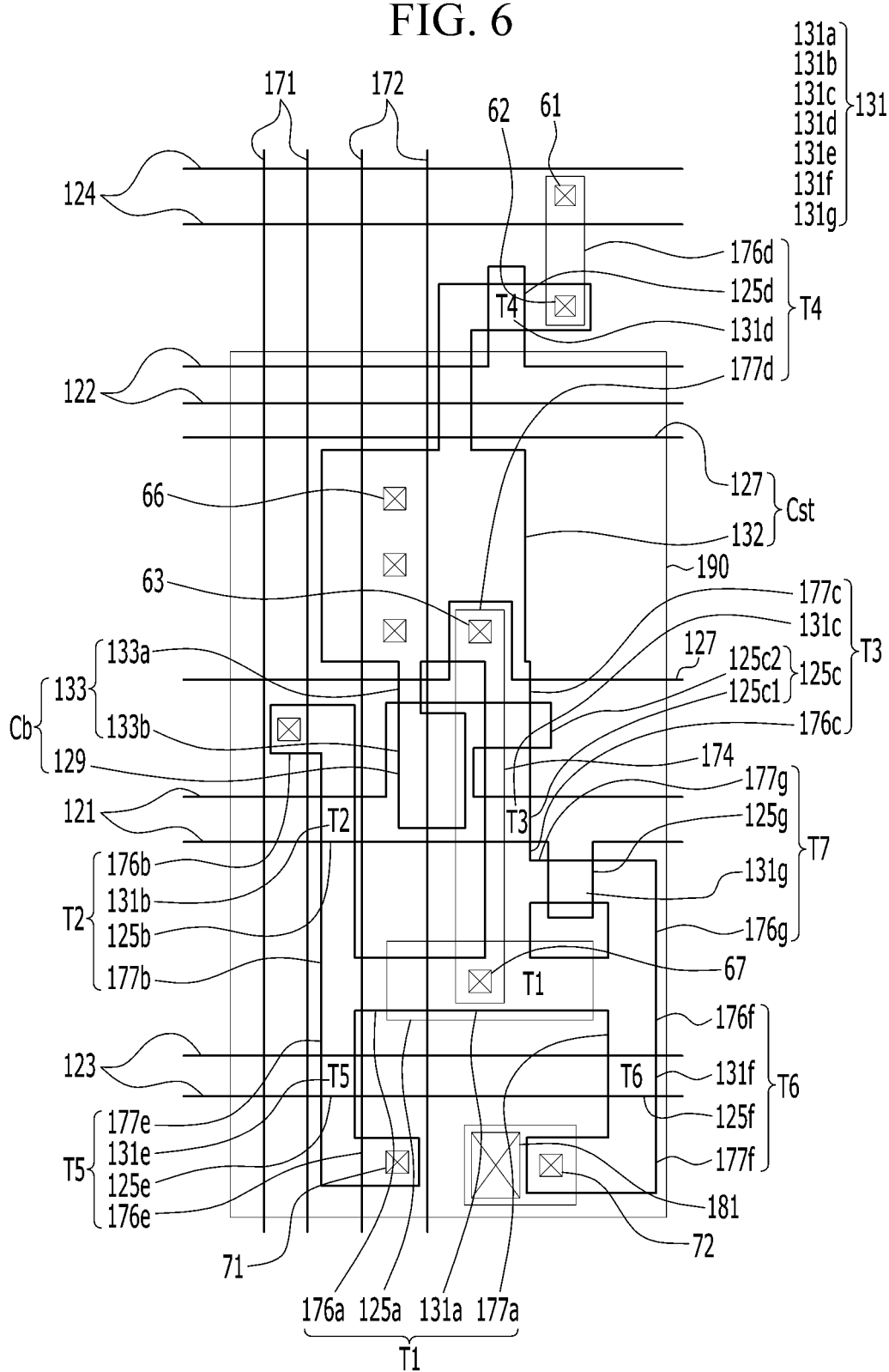
FIG. 6 is a detailed layout view of one pixel of an organic light emitting diode (OLED) display according to the second exemplary embodiment.

FIG. 6 is a detailed layout view of one pixel of an organic light emitting diode (OLED) display according to the second exemplary embodiment.

The second exemplary embodiment is substantially equivalent to the first exemplary embodiment shown in FIG. 1 to FIG. 5 except for the dual compensation gate electrode such that the overlapping description is omitted.

As shown in FIG. 6, the compensation gate electrode 125c of the organic light emitting diode (OLED) display according to the second exemplary embodiment may include a first compensation gate electrode 125c1 and a second compensation gate electrode 125c2. As described above, by forming the dual compensation gate electrode, the off-leakage current leaking through the compensation semiconductor layer 131c may be prevented.

Meanwhile, in a third exemplary embodiment, there is not the boosting capacitor. In a fourth exemplary embodiment, there is not at least one of the dual compensation gate electrode and the boosting capacitor.

Figure 7:
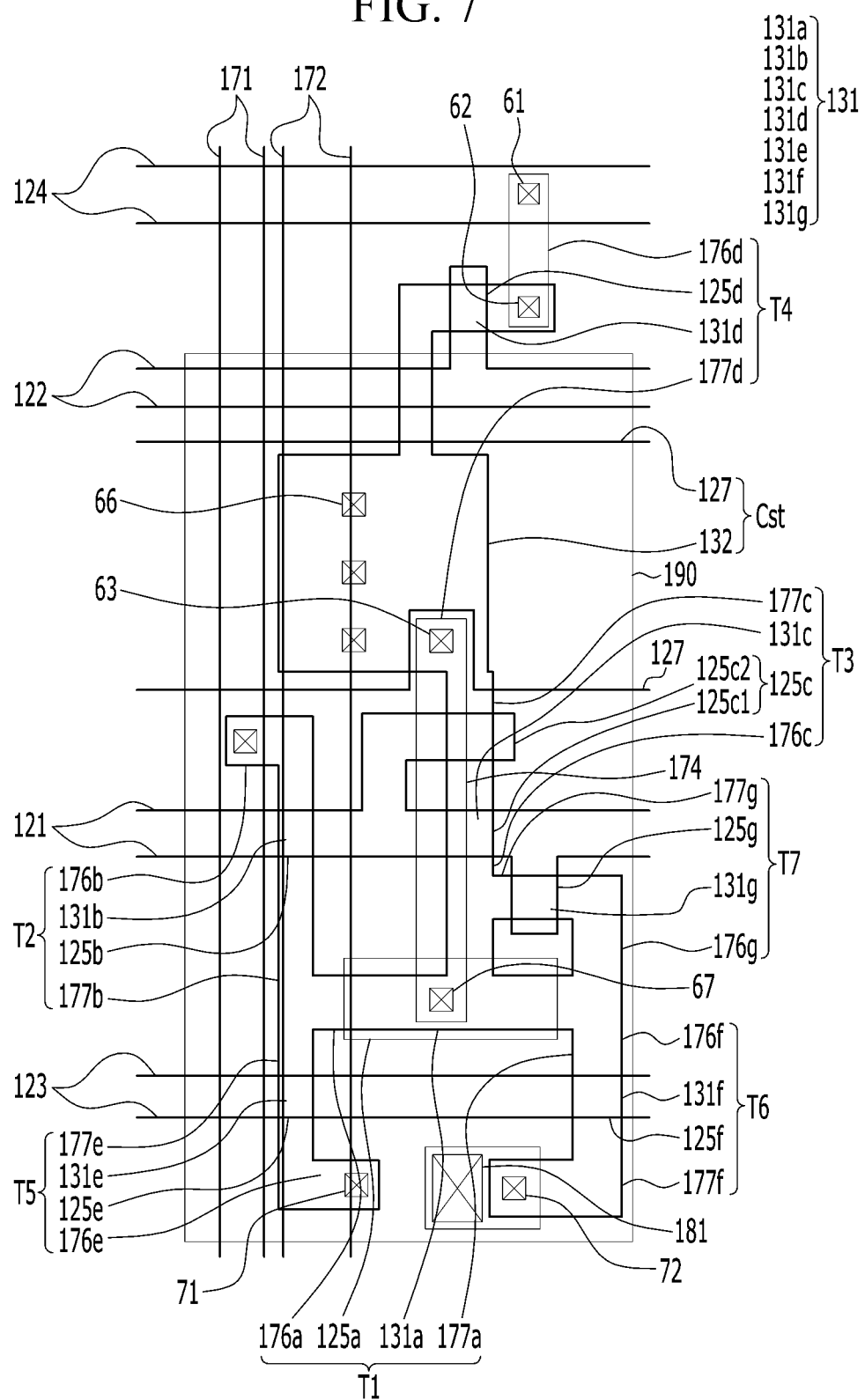
FIG. 7 is a detailed layout view of one pixel of an organic light emitting diode (OLED) display according to the third exemplary embodiment.
Figure 8:
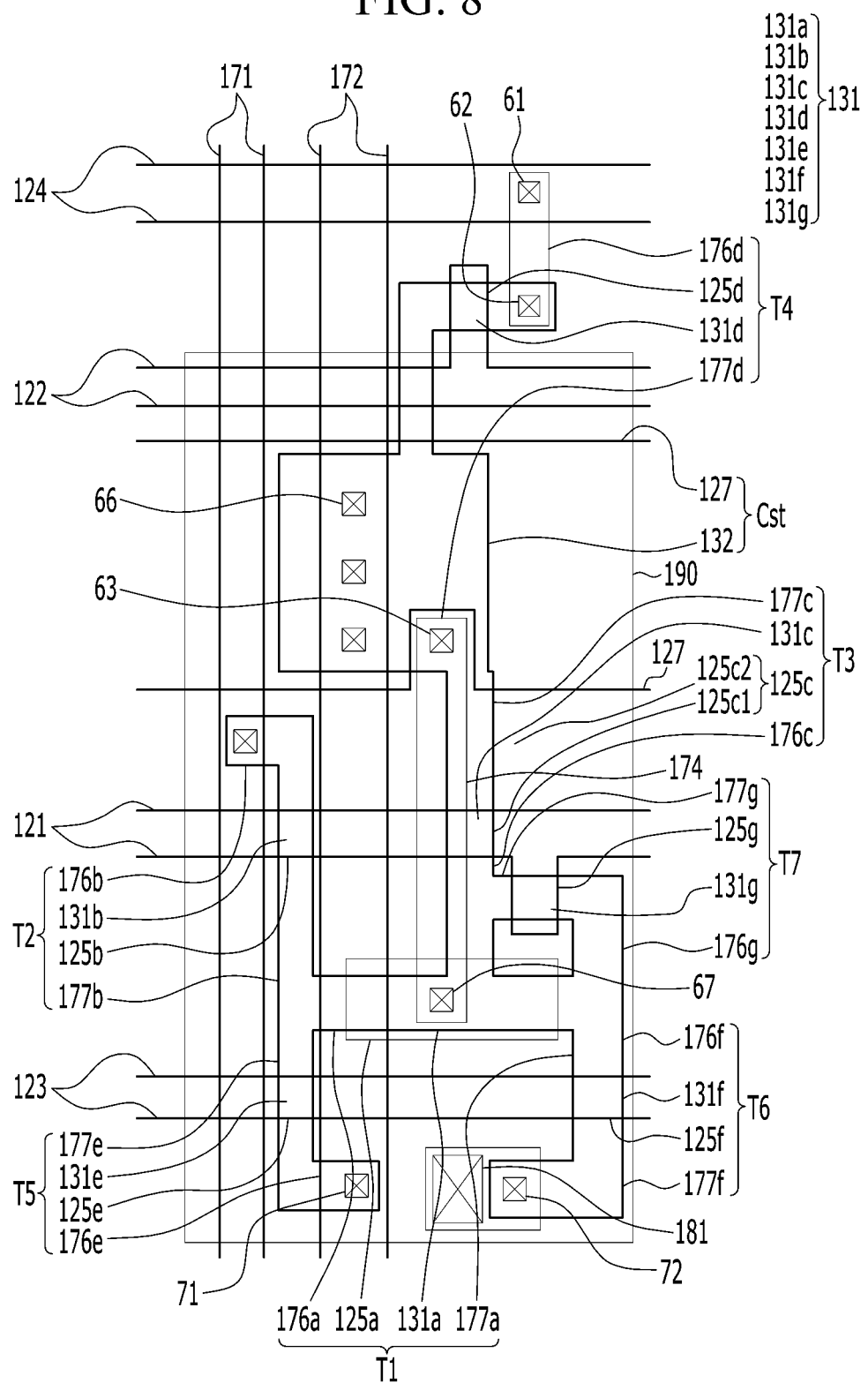
FIG. 8 is a detailed layout view of one pixel of an organic light emitting diode (OLED) display according to the fourth exemplary embodiment.

FIG. 7 is a detailed layout view of one pixel of an organic light emitting diode (OLED) display according to the third exemplary embodiment, and FIG. 8 is a detailed layout view of one pixel of an organic light emitting diode (OLED) display according to the fourth exemplary embodiment.

The third exemplary embodiment is substantially equivalent to the second exemplary embodiment shown in FIG. 6 except for the boosting capacitor, and the fourth exemplary embodiment is substantially equivalent to the third exemplary embodiment shown in FIG. 7 except for the dual compensation gate electrode, such that the overlapping description is omitted.

As shown in FIG. 7, in the organic light emitting diode (OLED) display according to the third exemplary embodiment, the boosting capacitor is not separately formed, and as shown in FIG. 8, in the organic light emitting diode (OLED) display according to the fourth exemplary embodiment, the dual compensation gate electrode and the boosting capacitor are not separately formed.

The aging transistor T7 may include the aging semiconductor layer 131g, the aging gate electrode 125g, the aging source electrode 176g and the aging drain electrode 177g. The aging source electrode 176g may correspond to the compensation source region doped with the impurity in the aging semiconductor layer 131g. The aging drain electrode 177g may correspond to the compensation drain region doped with the impurity in the aging semiconductor layer 131g.

The aging transistor T7 may connect the driving drain electrode 177a of the driving transistor T1 and the source electrode 176c of the compensation transistor T3 to each other. That is, the aging semiconductor layer 131g of the aging transistor T7 may connect the compensation semiconductor layer 131c of the compensation transistor T3 and the light emission control semiconductor layer 131f to each other.

The compensation semiconductor layer 131c may be split from the middle part of the driving semiconductor layer 131a. The light emission control semiconductor layer 131f of the light emission control transistor T6 may be connected to the driving drain region 177a of the driving semiconductor layer 131a. As such, a length of the first path CH1 from the driving semiconductor layer 131a to the compensation semiconductor layer 131c and a length of the second path CH2 from the driving semiconductor layer 131a to the light emission control semiconductor layer 131f may be different from each other and thereby currents of different magnitudes may simultaneously flow.

In a short pass diode structure, by overlapping the aging gate electrode 125g of the aging transistor T7 to the aging semiconductor layer 131g, a short pass through which the current quickly flows from the driving semiconductor layer 131a to the compensation semiconductor layer 131c may be formed in the compensation period and the scan line 121 may be turned on such that the threshold voltage Vth of the driving transistor T1 may be quickly compensated. In addition, a long pass through which the current flows from the driving semiconductor layer 131a to the light emission control semiconductor layer 131f may be formed in the light emission period and the scan line 121 may be turned off such that the driving range of the driving semiconductor layer 131a may be widened and thereby stains are prevented.

Also, in a short pass diode structure, by forming the aging transistor T7, the aging semiconductor layer 131g of the aging transistor T7 may connect the compensation semiconductor layer 131c of the compensation transistor T3 and the light emission control semiconductor layer 131f to each other. The aging transistor T7 may connect the driving drain electrode 177a of the driving transistor T1 and the source electrode 176c of the compensation transistor T3 to each other. Accordingly, the path for applying the aging voltage in the aging process may be obtained such that the aging process for removing the leakage current of the compensation transistor T3 may be performed.

While this disclosed technology has been described in connection with what is presently considered to be practical exemplary embodiments, it is to be understood that the disclosed technology is not limited to the disclosed embodiments, but, on the contrary, is intended to cover various modifications and equivalent arrangements included within the spirit and scope of the appended claims.

For purposes of summarizing the disclosed technology, certain aspects, advantages and novel features of the disclosed technology have been described herein. It is to be understood that not necessarily all such advantages may be achieved in accordance with any particular embodiment of the disclosed technology. Thus, the disclosed technology may be embodied or carried out in a manner that achieves or optimizes one advantage or group of advantages as taught herein without necessarily achieving other advantages as may be taught or suggested herein.

Various modifications of the above described embodiments will be readily apparent, and the generic principles defined herein may be applied to other embodiments without departing from the spirit or scope of the disclosed technology. Thus, the present disclosed technology is not intended to be limited to the embodiments shown herein but is to be accorded the widest scope consistent with the principles and novel features disclosed herein.

What is claimed is:

1. An organic light emitting diode (OLED) display comprising:
   a substrate;
   a scan line formed on the substrate and configured to transmit a scan signal;
   a data line intersecting the scan line and configured to transmit a data signal;
   a switching transistor connected to the scan line and the data line;
   a driving transistor connected to a switching drain electrode of the switching transistor;
   a compensation transistor connected to the driving transistor and configured to compensate a threshold voltage of the driving transistor;
   an aging transistor connected to a driving drain electrode of the driving transistor and a source electrode of the compensation transistor, the aging transistor further configured to perform an aging process for reducing a leakage current of the compensation transistor; and an organic light emitting diode (OLED) connected to the driving drain electrode of the driving transistor.

2. The organic light emitting diode (OLED) display of claim 1, further comprising a light emission control transistor positioned between the driving drain electrode and the organic light emitting diode (OLED), wherein the light emission control transistor is turned on by a light emission control signal, wherein a light emission control line is configured to transfer the light emission control signal, and wherein the light emission control transistor is further configured to transfer the driving voltage from the driving transistor to the organic light emitting diode.

3. The organic light emitting diode (OLED) display of claim 2, wherein the compensation semiconductor layer is split from a middle part of the driving semiconductor layer, and wherein the light emission control semiconductor layer of the light emission control transistor is connected to a driving drain region of the driving semiconductor layer.

4. The organic light emitting diode (OLED) display of claim 3, wherein the aging semiconductor layer of the aging transistor connects a compensation semiconductor layer of the compensation transistor and the light emission control semiconductor layer.

5. The organic light emitting diode (OLED) display of claim 4, wherein the aging gate electrode of the aging transistor overlaps the aging semiconductor layer.

6. The organic light emitting diode (OLED) display of claim 5, wherein the compensation gate electrode of the compensation transistor includes:
 a first compensation gate electrode, and
 a second compensation gate electrode separated from the first compensation gate electrode.

7. The organic light emitting diode (OLED) display of claim 6, further comprising a storage capacitor connected between the driving voltage line and the driving gate electrode of the driving transistor, wherein the storage capacitor includes:
 a first storage capacitive plate formed with the same layer as the driving semiconductor layer, and
 a second storage capacitive plate overlapping the first storage capacitive plate and formed with the same layer as the scan line.

8. The organic light emitting diode (OLED) display of claim 7, further comprising
 a boosting capacitor connected to the storage capacitor, wherein the boosting capacitor includes a first boosting capacitive plate extended from the first storage capacitive plate, and
 a second boosting capacitive plate overlapping the first boosting capacitive plate and extended from the scan line.

9. The organic light emitting diode (OLED) display of claim 7, wherein the data signal is configured to charge the storage capacitor to a predetermined voltage via the compensation transistor.

10. The organic light emitting diode (OLED) display of claim 8, wherein the first boosting capacitor plate has a hammer shape, and wherein the first boosting capacitor plate includes:
 a handle portion parallel to the driving voltage line, and
 a head portion formed at the end of the handle portion.

11. The organic light emitting diode (OLED) display of claim 1, wherein the compensation transistor connects to the scan line.

12. The organic light emitting diode (OLED) display of claim 11, wherein the compensation transistor is turned on corresponding to the scan signal.

13. The organic light emitting diode (OLED) display of claim 1, wherein the compensation transistor is further configured to perform a diode-connection of the driving transistor.

14. The organic light emitting diode (OLED) display of claim 13, wherein the driving transistor is diode-connected by the compensation transistor, and wherein the driving transistor is biased in a forward direction.

15. The organic light emitting diode (OLED) display of claim 1 further comprising an initialization transistor and an initialization voltage line, wherein the initialization transistor is further configured to initialize the driving transistor.

16. The organic light emitting diode (OLED) display of claim 1 further comprising a compensation semiconductor layer formed in the compensation transistor.

17. The organic light emitting diode (OLED) display of claim 1, wherein the aging transistor is further configured to apply an aging voltage in the aging processing to reduce the leakage current of the compensation transistor.

18. The organic light emitting diode (OLED) display of claim 1, further comprising a driving voltage line intersecting the scan line, the driving voltage line configured to transmit a driving voltage.

* * * * *